United States Patent
Jin et al.

(10) Patent No.: US 9,224,453 B2
(45) Date of Patent: Dec. 29, 2015

(54) WRITE-ASSISTED MEMORY WITH ENHANCED SPEED

(71) Applicant: QUALCOMM Incorporated, San Diego, CA (US)

(72) Inventors: Peng Jin, San Diego, CA (US); Mohamed Hassan Abu-Rahma, San Diego, CA (US); Fahad Ahmed, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 128 days.

(21) Appl. No.: 13/799,532

(22) Filed: Mar. 13, 2013

(65) Prior Publication Data

US 2014/0269018 A1    Sep. 18, 2014

(51) Int. Cl.
*G11C 11/419*    (2006.01)
*G11C 5/14*    (2006.01)

(52) U.S. Cl.
CPC ............... *G11C 11/419* (2013.01); *G11C 5/14* (2013.01); *G11C 5/147* (2013.01); *G11C 5/148* (2013.01)

(58) Field of Classification Search
CPC .................... G11C 11/413; G11C 11/419
USPC ........................................................ 365/154
See application file for complete search history.

(56) References Cited

U.S. PATENT DOCUMENTS

| | | | |
|---|---|---|---|
| 5,777,935 A | 7/1998 | Pantelakis et al. | |
| 6,771,550 B2 | 8/2004 | Park | |
| 6,785,179 B1 | 8/2004 | Bull et al. | |
| 7,313,032 B2 * | 12/2007 | Ellis et al. | 365/189.09 |
| 8,130,579 B2 * | 3/2012 | Kumar et al. | 365/203 |
| 2009/0303819 A1 | 12/2009 | Park et al. | |
| 2010/0290269 A1 | 11/2010 | Fujimura | |
| 2012/0147686 A1 | 6/2012 | Takayama et al. | |
| 2013/0021839 A1 * | 1/2013 | Ishikura et al. | 365/154 |

OTHER PUBLICATIONS

International Search Report and Written Opinion—PCT/US2014/022752—ISA/EPO—Jun. 18, 2014.
Ohbayashi S., et al., "A 65-nm SoC Embedded 6T-SRAM Designed for Manufacturability With Read and Write Operation Stabilizing Circuits", IEEE Journal of Solid-State Circuits, IEEE Service Center, Piscataway, NJ, USA, vol. 42, No. 4, 1 Apr. 1, 2007,pp. 820-829, XP011175868, ISSN: 0018-9200, DOI:10.1109/JSSC.2007.891648.

* cited by examiner

*Primary Examiner* — Hoai V Ho
*Assistant Examiner* — Tri Hoang
(74) *Attorney, Agent, or Firm* — Haynes and Boone, LLP

(57) ABSTRACT

A write-assisted memory includes a pre-charge assist circuit that assists the pre-charge of the power supply voltage on a power supply lead for an accessed memory cell in a bit-line-multiplexed group of memory cells subsequent to a write-assist period by coupling charge from the power supply leads for the remaining non-accessed memory cells in the bit-line-multiplexed group of memory cells.

20 Claims, 5 Drawing Sheets

WRITE-ASSISTED MEMORY WITH ENHANCED SPEED

TECHNICAL FIELD

This application relates to a write-assisted memory, and more particularly to a write-assisted memory including a pre-charge assist circuit.

BACKGROUND

As nanometer technology nodes advance more and more into the deep sub-micron regimes, static random access memory (SRAM) design must face increasingly stringent requirements. As the devices are scaled down, the supply voltage must also be scaled lower to reduce power consumption. The successful design of SRAMs with the resulting minimum-size transistors at the reduced power supply voltages is quite challenging. For example, write failure becomes an issue in such highly-scaled memories. In a write failure, the write operation is unsuccessful at flipping the stored value in the memory cell.

Some basic SRAM operation concepts will now be discussed to better illustrate the challenges of scaling SRAM into the advanced process nodes. An SRAM memory cell comprises a pair of cross-coupled inverters. If a first one of the cross-coupled inverters is driving out a stored data value Q, that value is inverted by the remaining second cross-coupled inverter as the complementary value $\overline{Q}$. But the second cross-coupled inverter drives $\overline{Q}$ as the input to the first cross-coupled inverter, which reinforces its Q output, which in turn reinforces the $\overline{Q}$ output of the second cross-coupled inverter. An SRAM memory cell thus latches the desired Q value into the pair of cross-coupled inverters and robustly holds this latched value.

Each cross-coupled inverter comprises a serial stack of a pull-up PMOS transistor and a pull-down NMOS transistor. The pull-up PMOS transistors are also denoted as the load transistors. Because the stacked PMOS and NMOS transistors are powered by a power supply, an SRAM cell drives out its stored memory cell value through the resulting gain in the powered transistors. In contrast, a dynamic random access memory (DRAM) memory cell has no such active drive. Instead, a DRAM memory cell has a passive capacitor for storing the memory cell value. For this reason, SRAM operation is much faster than for a comparable DRAM.

Although this cross-coupled interaction in an SRAM memory cell is one of its strengths, it also becomes a problem in the advanced process nodes. For example, an SRAM memory cell is accessed in a read or write operation through a pair of NMOS access transistors. These NMOS access transistors cannot be too strong compared to the pull-up PMOS transistors or a read operation would destroy the stored memory cell value. In advanced process nodes, however, the pull-up PMOS transistors become too strong as compared to the NMOS access transistors. The write operation can thus fail to flip the stored memory cell value at advanced process nodes.

Several techniques have been developed to address this write failure. For example, the supply voltage to an SRAM memory cell may be lowered during a write operation to the SRAM memory cell. The lowered supply voltage weakens the pull-up PMOS transistors so that the write operation may invert (if necessary) the binary state of the stored memory cell value. Although this write-assist technique is successful to address write failure, the write frequency suffers because the memory cell supply voltage must recover to its default value after completion of the write-assisted write operation.

Accordingly, there is a need in the art for improved write-assisted memories having faster operation speeds.

SUMMARY

In a bit-line multiplexed group of memory cells, when a given one of the memory cells in the group is accessed by being written to in a write operation, the remaining memory cells in the group are non-accessed memory cells. In this fashion, only one memory cell in the group is accessed in any given write operation. To achieve faster operation speeds for a write-assisted bit-line multiplexed group of memory cells, a write-assist circuit is provided that assists a pre-charge of a power supply voltage on a power supply lead for an accessed memory cell upon completion of a write-assist period or duration. The pre-charge assist circuit assists the pre-charge by coupling charge from power supply leads for the non-accessed memory cells to the power supply lead for the accessed memory cell.

DETAILED DESCRIPTION

To meet the need in the art for greater recovery speed in write-assisted memories, a bit-line-multiplexed memory is configured to share charge during the pre-charge recovery from a write-assisted write operation. The charge sharing exploits the bit-line-multiplexing architecture of modern memory designs as is known in the arts. With regard to such multiplexing, a memory cell such as an SRAM memory cell is constructed from transistors that fully exploit the small dimensions available in advanced process nodes. But the sense amplifier for sensing the stored memory cell value cannot be formed from such small transistors in that a sense amplifier requires sufficient gain to quickly make the bit decisions. The relatively large transistors for a sense amplifier cannot be arranged within the bit-line pitch for a single memory cell. The memory cells and their associated bit lines are thus multiplexed in bit-line multiplexed groups, each group being served by a corresponding sense amplifier.

The number of multiplexed bit lines (and corresponding memory cells) per each sense amplifier determines the resulting aspect ratio of the memory. A common group size for such multiplexing is four, eight, or sixteen memory cells. The following discussion concerns a 4:1 bit-line multiplexing scheme but it will be appreciated that the pre-charge assist circuits and techniques discussed herein are widely applicable to other multiplexing groupings. The memory cells in a 4:1 bit-line multiplexed group are denoted herein as a multiplexed bitcell.

As known in the write-assisted memory arts, each memory cell is powered through a corresponding write-assist circuit. A memory cell receives power from a power supply lead controlled by its write-assist circuit. The write-assist circuit couples between its memory cell's power supply lead and a power supply node. The power supply node supplies the default power supply voltage vdd. Because of the bit-line multiplexing, only one memory cell in a multiplexed bitcell is accessed in any given write operation. The remaining memory cells in a bit-line multiplexed group (the remaining memory cells in the multiplexed bitcell) are non-accessed memory cells for that particular write operation. Thus, the write-assist circuits for the non-accessed memory cells maintain the power supply voltages on the power supply leads to the non-accessed memory cells at the undiminished default power supply value vdd. But the write-assist circuit for the accessed memory cell lowers the supply voltage to the accessed memory cell while the accessed memory cell is written to in a write-assisted write operation.

Figure 1A:
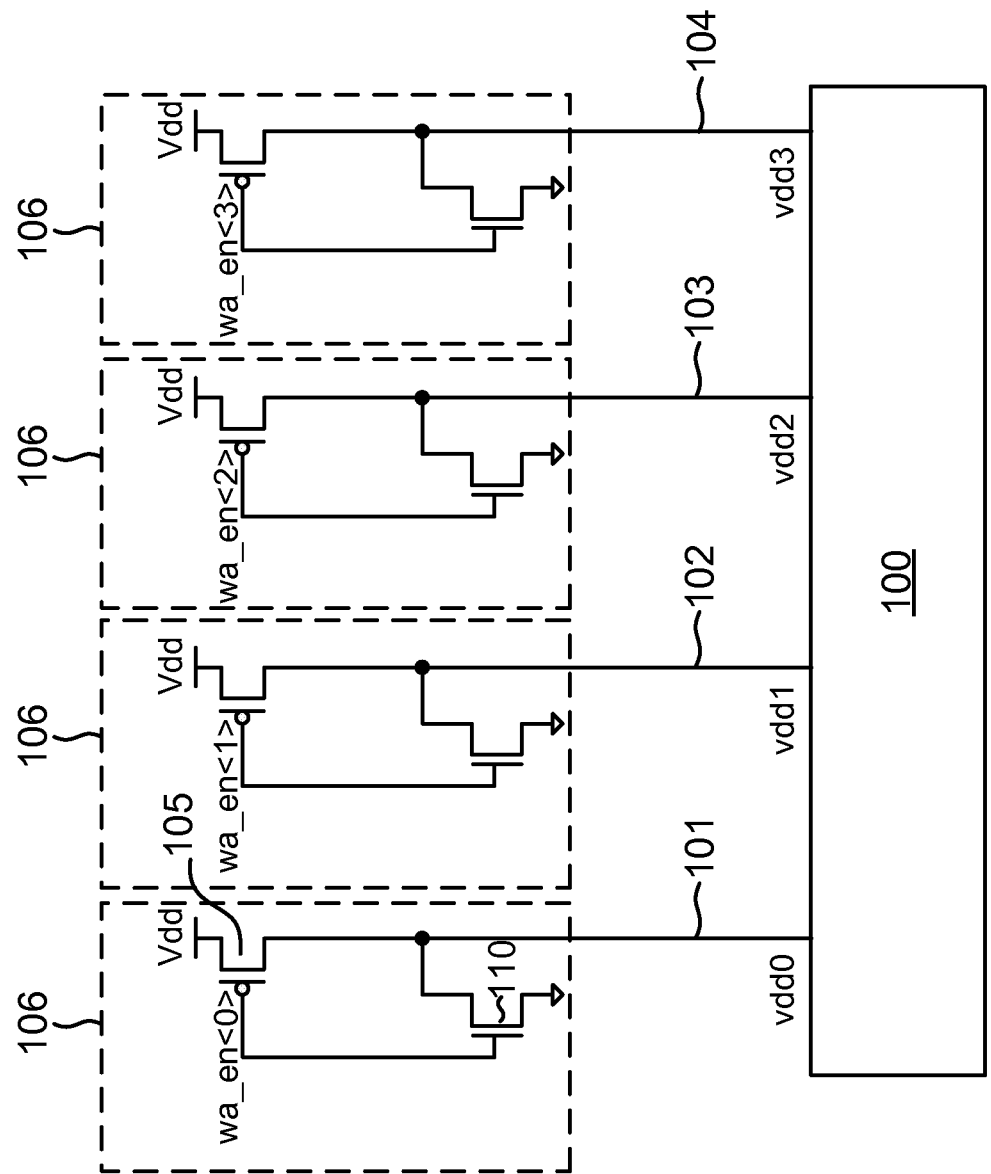
FIG. 1A is a schematic diagram of the write-assist circuits and corresponding power supply leads for a bit-line multiplexed group of memory cells.

FIG. 1A illustrates an example 4:1 bit-line multiplexed group of memory cells (a multiplexed bitcell) 100. Each memory cell in multiplexed bitcell 100 has its own power supply input or lead. Because bit-line multiplexing is well known in the memory arts, the memory cells and their corresponding bit lines within multiplexed bitcell 100 are not illustrated. Since multiplexed bitcell 100 includes four SRAM cells, there are four separate power supply leads to multiplexed bitcell 100. A power supply input or lead 101 provides a supply voltage vdd0 to the first memory cell, a power supply lead 102 provides a supply voltage vdd1 to a second memory cell, a power supply lead 103 provides a supply voltage vdd2 to a third memory cell, and a power supply lead 104 provides a supply voltage to a fourth memory cell vdd3.

These individual supply voltages power the pull-up PMOS transistors and pull-down NMOS transistors in their respective memory cells. Each power supply lead is powered through a corresponding write-assist circuit 106. For example, a first memory cell receives power supply voltage vdd0 through power supply lead 101 as controlled by a corresponding write-assist circuit 106.

Each write-assist circuit 106 includes a head switch 105 and a pull down device 110. In write-assist circuits 106, head switches 105 are PMOS transistors whereas pull down devices 110 are NMOS transistors. Within a given write-assist circuit 106, the gates of the corresponding PMOS transistor 105 and NMOS transistor 110 are controlled by a corresponding write-assist enable signal. For example, a write-assist enable signal wa_en<0> controls the voltage vdd0 on power supply lead 101, a write-assist enable signal wa_en<1> controls the voltage vdd1 on power supply lead 102, and so on such that a write-assist enable signal wa_en<3> controls the voltage vdd3 on power supply lead 104. In a default state, all the write assist enable signals are de-asserted so that all PMOS transistors 105 are on whereas all NMOS transistors 110 are off. Each PMOS transistor 105 has a source coupled to a power supply node providing the default power supply voltage vdd. In addition, each PMOS transistor 105 has a drain coupled to the corresponding power supply lead. Since the PMOS transistors 105 are all on in the default state, the power supply voltages vdd0 through vdd3 thus all equal the default value vdd. Each memory cell supply voltage is controlled to equal the default value vdd unless the corresponding memory cell is being written to during a write-assist period. Such a memory call may also be denoted as an accessed memory cell.

Figure 1B:
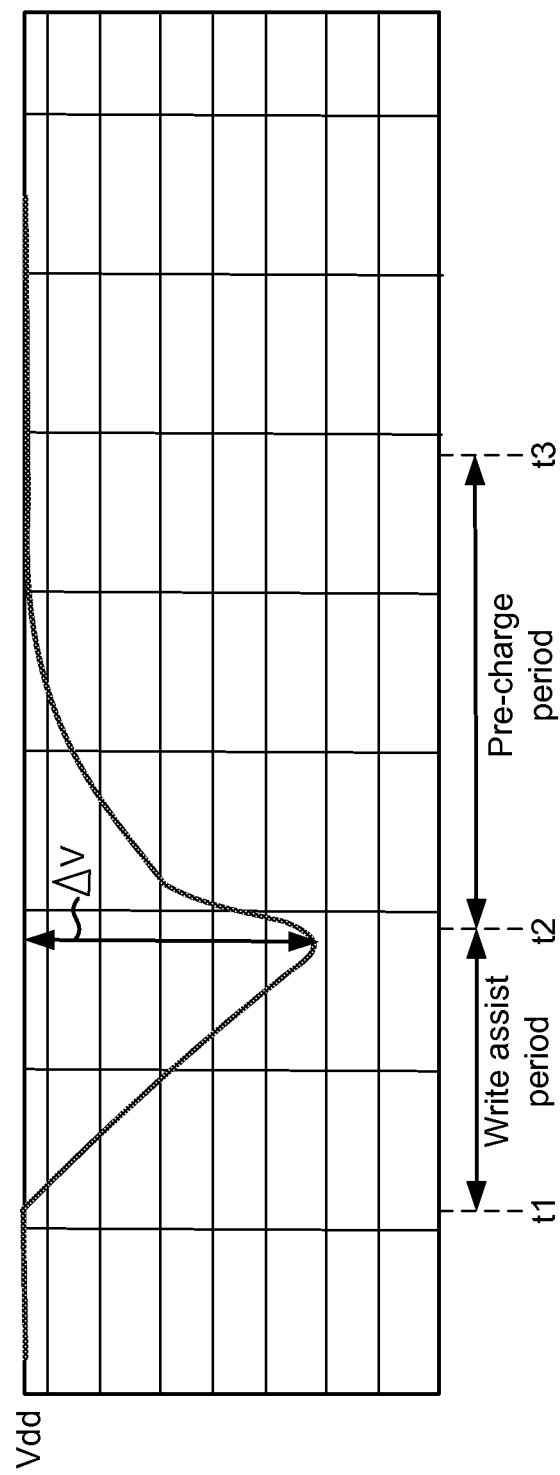
FIG. 1B is a waveform for the power supply voltage of a write-assisted memory cell.

If a memory cell is to be accessed during a write operation, the voltage on the appropriate memory cell power supply input is lowered from the default value vdd by a sufficient voltage amount Δv. For example, suppose the first memory cell is selected to be the accessed memory cell for a write operation. Corresponding write-assist enable signal wa_en<0> would then be temporarily asserted for a write-assist duration or period. In response, PMOS transistor 105 coupled to power supply lead 101 would thus turn off whereas NMOS transistor 110 coupled to this lead would turn on. Each NMOS transistor 110 couples between the corresponding power supply lead and ground. When NMOS transistor 110 coupled to power supply lead 101 is conducting, charge on power supply lead 101 may then conduct into ground. The power supply voltage vdd0 for the first memory cell would thus dip temporarily below vdd to weaken the strength of the pull-up PMOS transistors in the first memory cell. FIG. 1B illustrates the power supply voltage dip for the vdd0 voltage during the write-assist period, which begins at time t1 and ends at time t2. At time t2, the desired logical value has been written into the first memory cell. At this point, the lowered supply voltage vdd0 needs to be restored to the default voltage level, vdd. This recovery of the write-assist-lowered supply voltage to an accessed memory cell is denoted as the pre-charge period and extends between time t2 and t3 in FIG. 1B.

In the prior art, the pre-charge operation is performed by a memory cell's write-assist circuit 106. The corresponding write-assist enable signal such as we_en<0> is thus brought low at time t2 (the write-assist enable signals for the remaining non-accessed memory cells having been maintained low in the default state). PMOS transistor 105 then pulls up the voltage on the corresponding power supply lead. But because of the bit line pitch, PMOS transistor 105 cannot be made large and correspondingly strong to quickly pull-up the memory cell supply voltage. Thus, the prior-art pre-charge duration or period was relatively long due to the necessary weakness of PMOS transistors 105. But the pre-charge operation disclosed herein is advantageously faster through charge sharing from the non-accessed memory cells' power supply leads through a pre-charge assist circuit. It is denoted as an "assist" circuit in that write-assist circuits 106 continue to act as they did in the prior art with regard to the pre-charging process. But additional charge is supplied to the power supply lead for an accessed memory cell through the pre-charge assist circuits disclosed herein. In this fashion, write-assisted memories including a pre-charge assist circuit have advantageously faster operation through the shortened pre-charge durations.

Figure 2:
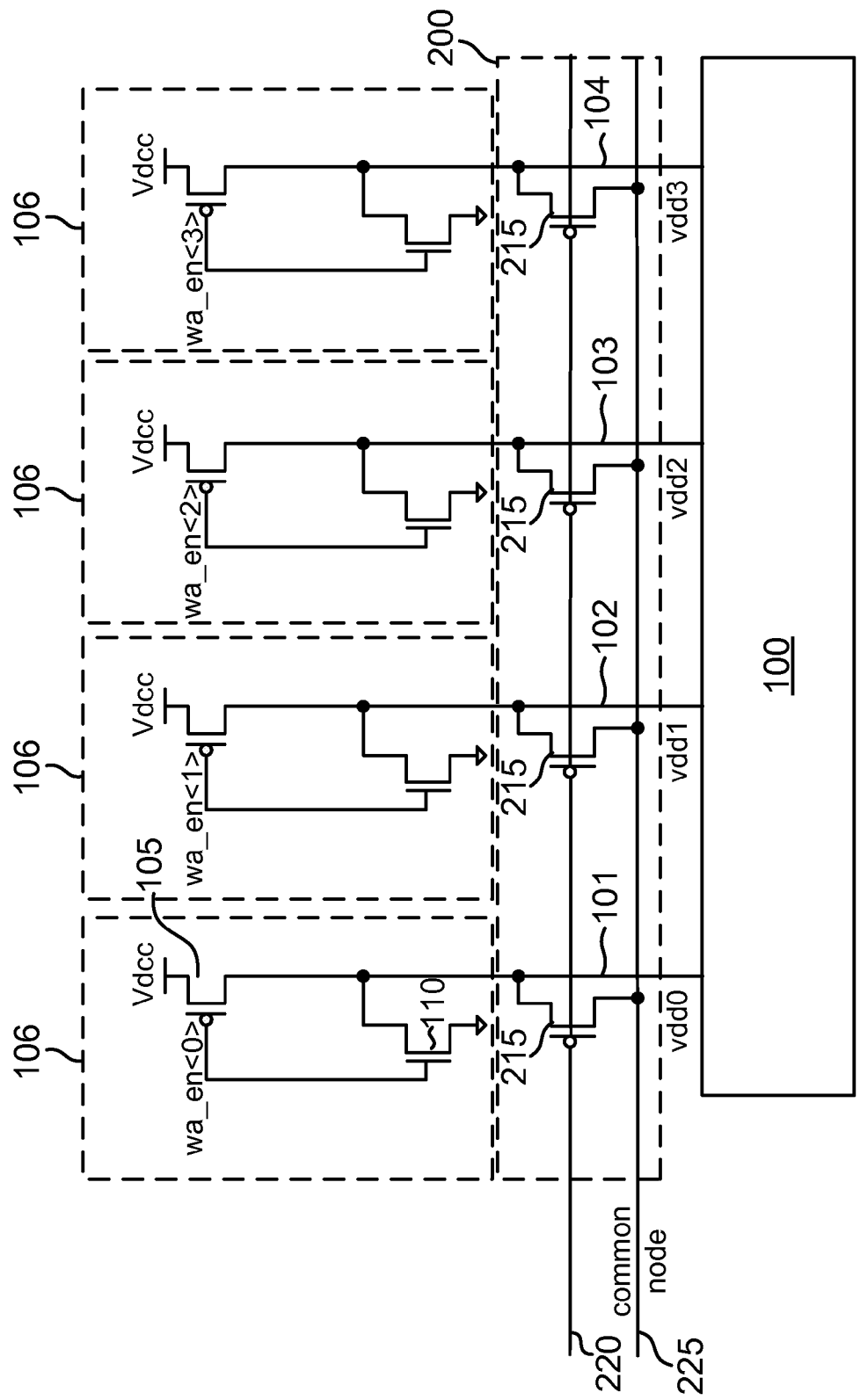
FIG. 2 is a schematic diagram of a first pre-charge assist circuit and corresponding write-assist circuits for a bit-line-multiplexed group of memory cells.

A first embodiment for a pre-charge assist circuit 200 is shown in FIG. 2. The memory cells in bit-line multiplexed group 100 and write-assist circuits 106 are constructed and function as discussed with regard to FIG. 1A. Thus, each write-assist circuit 106 controls the voltage on its power supply lead responsive to a write enable signal. Pre-charge assist circuit 200 enables a rapid pre-charge of a write-assist-lowered supply voltage to an accessed memory cell. Pre-charge assist circuit 200 includes a plurality of pre-charge switches such as PMOS transistors 215 and also a common node 225. The gates of PMOS transistors 215 are controlled by a pre-charge enable signal 220. A first drain/source terminal for each PMOS transistors 215 couples to common node 225, which may comprise a conductor in a metal layer distinct from a metal layer supporting the bit lines for the memory cells in group 100. A second drain/source terminal for each PMOS transistor 215 couples to the corresponding power supply lead. For example, a second terminal for a first PMOS transistor 215 couples to power supply lead 101 for the first memory cell. Each power supply lead thus couples to the second terminal of a corresponding PMOS transistor 215.

In a default state (no write operation occurring), pre-charge enable signal 220 is asserted (held low) such that all PMOS transistors 215 are on. Common node 225 thus is charged to the power supply voltage vdd in the default state. But if a write-assist operation is to be conducted for a selected one of the memory cells in multiplexed bitcell 100, pre-charge enable signal 220 is de-asserted (brought high) such that PMOS transistors 215 are all switched off. Common node 225 then floats during the write-assist operation. Upon completion of the write-assist period (corresponding to time t2 in FIG. 1B), the pre-charge enable signal 220 is again asserted low. As discussed previously, the default value for the individual memory cell power supply voltages vdd0 through vdd3 is vdd. Only one of these memory cell supply voltages will be write-assist lowered in any given write operation. For example, suppose vdd0 has just been lowered such that the write-assist duration has ended. When pre-charge enable signal 220 is asserted, the charge on leads 102, 103, and 104 resulting from their default voltage vdd will flow through the corresponding PMOS transistors 215 to charge common node 225 to vdd (to the extent of whether common node 225 had discharged slightly while it was floating). In turn, the charge on common node 225 will flow through the PMOS transistor 215 coupled to lead 101 to pull the first memory cell power supply voltage vdd0 to the default value vdd. Since PMOS transistors 105 are also on at this time, a write-assist-lowered memory cell supply voltage such as that just described for voltage vdd0 is quickly pulled to the default value vdd.

Figure 3:
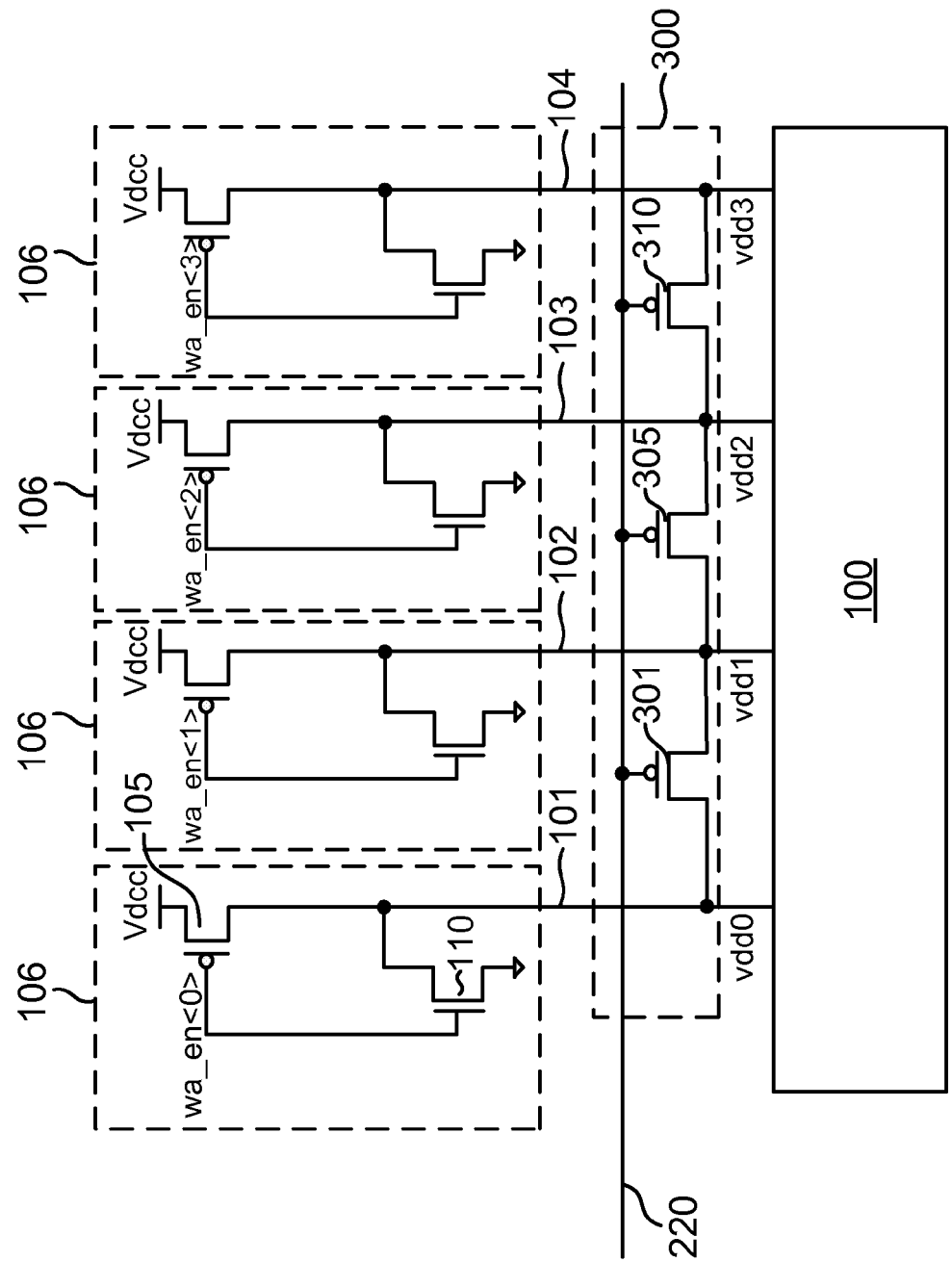
FIG. 3 is a schematic diagram of a second pre-charge assist circuit and corresponding write-assist circuits for a bit-line-multiplexed group of memory cells.

An alternative embodiment for a pre-charge assist circuit 300 is shown in FIG. 3. Three pre-charge switches are coupled between power supply inputs 101 through 104 such as PMOS transistors 301, 305, and 310. PMOS transistor 301 has one drain/source terminal tied to lead 101 and a remaining drain/source terminal tied to lead 102. Similarly, PMOS transistor 305 has one source/drain terminal tied to lead 102 and a remaining drain/source terminal tied to lead 103. In the same fashion, PMOS transistor 310 has one source/drain terminal tied to lead 103 and a remaining drain/source terminal tied to lead 104. The gates of transistors 301, 305, and 310 are driven by pre-charge enable signal 220. Pre-charge enable signal 220 is controlled in the same manner as discussed with regard to FIG. 1. Thus, pre-charge enable signal 220 is de-asserted (brought high since it is an active low signal) during the write-assist operation. Power supply leads 101, 102, 103, and 104 are thus isolated from each other during the write-assist period since PMOS transistors 301, 305, and 310 are off.

In the default state, pre-charge enable signal 220 is asserted (brought low). This default state begins at the beginning of the pre-charge period, whereupon PMOS transistors 301, 305, and 310 are turned on. The terminals for these transistors are each referred to as "drain/source" because the operation of one as a drain or as a source depends upon the particular memory cell being write-assisted and then pre-charged. For example, suppose supply voltage vdd0 on power supply lead 101 has been write-assist lowered. When pre-charge enable signal 220 is asserted, charge from power supply lead 102 as supplied by that lead's write-assist circuit 106 will flow through PMOS transistor 301 to assist in the pre-charging of voltage vdd0 back to the default value vdd. Charge from power supply leads 103 and 104 would also assist in this pre-charging as well. For example, charge from power supply lead 103 flows through PMOS transistor 305 and PMOS transistor 301 to assist in the pre-charging of the first memory cell supply voltage vdd0. Similarly, charge from power supply lead 104 flows through PMOS transistors 310, 305, and 301 to assist in the pre-charging of the first memory cell supply voltage vdd0. But if the second memory cell supply voltage vdd1 had been lowered instead of vdd0, charge from lead 101 would flow in the opposite direction through PMOS transistor 301 to assist in the pre-charging of voltage vdd1 back to its default value vdd. Thus, a given source/drain terminal for PMOS transistors 301, 305, and 310 can act as either a source or a drain. For the same reason, the first and second terminals for transistors 215 of pre-charge assist circuit 200 were also denoted as source/drain terminals.

Just like pre-charge assist circuit 200, pre-charge assist circuit 300 may be modified to accommodate any ratio of bit line multiplexing. In that regard, the memory cells and their corresponding power supply inputs or leads may be considered to be arranged from a first memory cell and first power supply input to a last memory cell and a last power supply input. Each power supply input ranging from the first power supply input through a next-to-last one of the power supply inputs would have its own pre-charge circuit switch. Each pre-charge switch couples between its corresponding power supply input and a power supply input for a subsequent one of the memory cells.

Regardless of the embodiment used to assist in the pre-charging a write-assist-lowered memory cell supply voltage, the resulting pre-charge assist significantly increases the recovery of the memory cell voltage. For example, simulation results indicate that the pre-charge assist circuits disclosed herein reduces the pre-charging duration by approximately 50%. In this fashion, a write-assisted memory with a pre-charge assist circuit may operate at significantly enhanced speeds.

Figure 4:
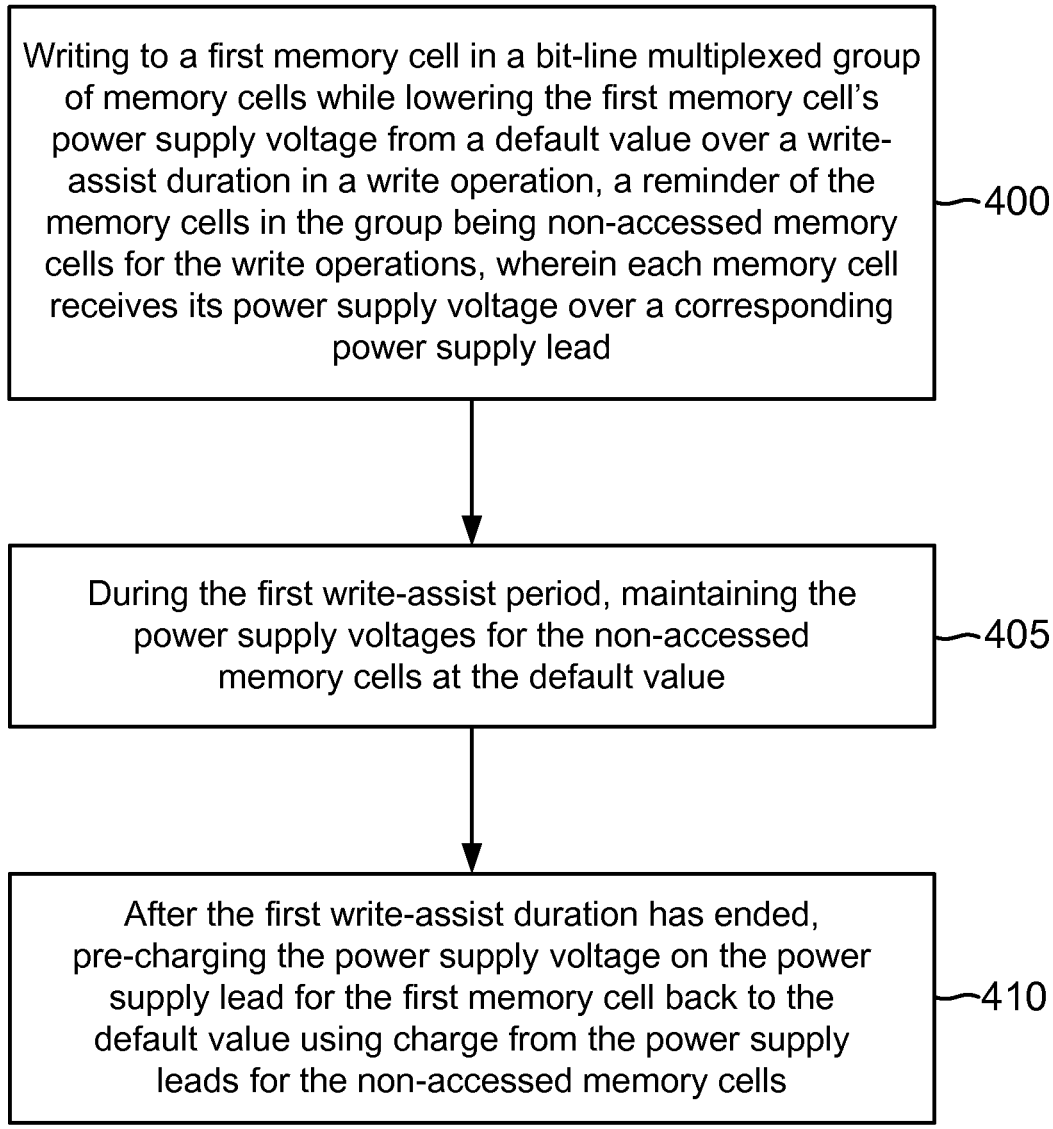
FIG. 4 is a flowchart of a method of operation for a pre-charge assist circuit and corresponding write-assist circuits for a bit-line multiplexed group of memory cells.

FIG. 4 is a flowchart for an example pre-charge assist method. In a step 400 comprise writing to a first memory cell in a bit-line multiplexed group of memory cells while lowering the first memory cell's power supply voltage from a default value over a first write-assist duration in a first write operation, a remainder of the memory cells in the group being first non-accessed memory cells for the first write operation, wherein each memory cell receives its power supply voltage over a corresponding power supply lead. A step 405 occurs during the first write-assist period and comprises maintaining the power supply voltages for the first non-accessed memory cells at the default value. A final step 410 occurs after the first write-assist duration has ended and comprises pre-charging the power supply voltage on the power supply lead for the first memory cell back to the default value using charge from the power supply leads for the first non-accessed memory cells.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:
1. A memory, comprising:
a plurality of SRAM cells a plurality of power supply leads corresponding to the plurality of SRAM cells, each SRAM cell coupled to its corresponding power supply lead to receive power;

a plurality of write assist circuits corresponding to the plurality of power supply leads, wherein each power supply lead couples to a power supply node through its corresponding write assist circuit, each write assist circuit being configured to lower a power supply voltage on its corresponding power supply lead during a write operation on the corresponding SRAM cell; and a pre-charge assist circuit including a plurality of pre-charge switches configured to couple the plurality of power supply leads together to share charge subsequent to each write operation.

2. The memory of claim 1, wherein each write-assist circuit is configured to control the power supply voltage on its corresponding power supply lead for the corresponding SRAM cell so as to maintain the power supply voltage at a default value while the corresponding SRAM cell is a non-accessed SRAM cell and so as to lower the power supply voltage from the default value during a write-assist period while the corresponding SRAM cell is an accessed SRAM cell in a write operation.

3. The memory of claim 2, wherein the pre-charge assist circuit includes a common node, and wherein the pre-charge assist circuit is further configured to assist in a pre-charge by coupling charge from the common node to the accessed SRAM cell's power supply lead upon completion of the write-assist period.

4. The memory of claim 3, further comprising a plurality of multiplexed bit lines comprising conductors in a first metal layer, and wherein the common node comprises a conductor in a second metal layer.

5. The memory of claim 3, wherein each pre-charge switch is coupled between the common node and the corresponding SRAM cell's power supply lead, the pre-charge switches being configured to be open during the write-assist period and to be closed during the pre-charge of the power supply voltage for the accessed SRAM cell.

6. The memory of claim 5, wherein each pre-charge switch comprises a pre-charge PMOS transistor having a gate driven by a pre-charge enable signal configured to be pulled to ground in a default state outside of the write-assist period and to be raised to a voltage equaling the default value during the write-assist period.

7. The memory of claim 5, wherein each write-assist circuit comprises a head switch coupled between the power supply node and the corresponding SRAM cell's power supply lead, and wherein each head switch is configured to be closed in a default state while the corresponding SRAM cell is a non-accessed SRAM cells and to be open during the write-assist period while the corresponding SRAM cell is the accessed SRAM cell during a write operation.

8. The memory of claim 7, wherein each write-assist circuit further comprises a pull-down switch coupled between the corresponding SRAM cell's power supply lead and ground, and wherein each pull-down switch is configured to be open in a default state while the corresponding SRAM cell is one of the non-accessed SRAM cells during a write operation and to be closed during the write-assist period while the corresponding SRAM cell is the accessed SRAM cell during a write operation.

9. The memory of claim 1, wherein the plurality of SRAM cells are arranged from a first SRAM cell an nth SRAM cell, n being a plural integer, and wherein the plurality of pre-charge switches comprises a plurality of (n−1) pre-charge switches corresponding to the first SRAM cell through an (n−1)th SRAM cell, each pre-charge switch being coupled between its corresponding SRAM cell's power supply lead and a subsequent SRAM cell's power supply lead, and wherein each pre-charge switch is configured to be open during a write assist period and to be closed at least during a pre-charge of the power supply voltage for the accessed SRAM cell.

10. The memory of claim 9, wherein each pre-charge switch comprises a PMOS transistor having a gate driven by a pre-charge enable signal configured to be pulled to ground in a default state outside of the write-assist period and to be raised to a default voltage during the write-assist period.

11. The memory of claim 9, wherein each write-assist circuit comprises a head switch coupled between the power supply node and the corresponding SRAM cell's power supply lead, and wherein each head switch is configured to be closed in a default state while the corresponding SRAM cell is one of the non-accessed SRAM cells during a write operation and to be open during the write-assist period while the corresponding SRAM cell is the accessed SRAM cell during a write operation, and wherein each write-assist circuit further comprises a pull-down switch coupled between the corresponding SRAM cell's power supply lead and ground, and wherein each pull-down switch is configured to be open in a default state while the corresponding SRAM cell is one of the non-accessed SRAM cells during a write operation and to be closed during the write-assist period while the corresponding SRAM cell is the accessed SRAM cell during a write operation.

12. A method, comprising:

writing to a first SRAM cell in a bit-line multiplexed group of SRAM cells while lowering a power supply voltage for the first SRAM cell from a default value over a first write-assist period in a first write operation, a remainder of the SRAM cells in the group of SRAM cells being first non-accessed SRAM cells for the first write operation, wherein each SRAM cell receives its power supply voltage over a corresponding power supply lead;

during the first write-assist period, maintaining the power supply voltages for the first non-accessed SRAM cells at the default value; and after the first write-assist period has ended, pre-charging the power supply voltage on the power supply lead for the first SRAM cell back to the default value using charge from the power supply leads for the first non-accessed SRAM cells.

13. The method of claim 12, further comprising:

writing to a second one of the SRAM cells in the group while lowering the second SRAM cell's power supply voltage from the default value over a second write-assist period in a second write operation, a remainder of the SRAM cells in the group of SRAM cells being second non-accessed SRAM cells for the second write operation;

during the second write-assist period, maintaining the power supply voltages for the second non-accessed SRAM cells at the default value; and after the second write-assist period has ended, pre-charging the power supply voltage for the second SRAM cell to the default value using charge from the power supply leads to the second non-accessed SRAM cells.

14. The method of claim 12, further comprising:

prior to the first write-assist period, charging each of the power supply leads to a voltage equaling the default value while each power supply lead couples to a common node, during the first write-assist period, isolating each power supply lead from the common node; and during the pre-charge of the power supply voltage on the power supply lead for the first SRAM cell, again coupling each power supply lead to the common node.

15. The method of claim 12, further comprising:

prior to the first write-assist period, charging each of the power supply leads to a voltage equaling the default value; and during the pre-charge of the power supply voltage on the power supply lead for the first SRAM cell, coupling the power supply lead for the first SRAM cell to the power supply leads for the first non-accessed SRAM cells.

16. The method of claim 14, wherein coupling each power supply lead to the common node comprises coupling each power supply lead through a corresponding switch to the common node.

17. The method of claim 15, wherein coupling the power supply lead for the first SRAM cell to the power supply leads for the first-non-accessed SRAM cells comprises coupling the power supply lead for the first SRAM cell through a first switch to a power supply lead for a neighboring one of the first non-accessed SRAM cells.

18. A memory, comprising:

a bit-line multiplexed group of memory cells configured such that while a memory cell in the group is accessed in a write-assisted write operation, a remainder of the memory cells in the group are non-accessed memory cells; and means for assisting a pre-charge of a power supply voltage on a power supply lead for an accessed one of the memory cells upon completion of a write-assist period by coupling charge from power supply leads for the non-accessed memory cells to the accessed memory cell's power supply lead.

19. The memory of claim 18, wherein the memory cells are SRAM memory cells.

20. The memory of claim 18, wherein the means comprises a plurality of switches coupled to the power supply leads.

* * * * *